(12) United States Patent
Wang et al.

(10) Patent No.: US 10,079,577 B2
(45) Date of Patent: Sep. 18, 2018

(54) SIGNAL AMPLIFICATION CIRCUIT (71) Applicant: CSMC TECHNOLOGIES FAB2 CO., LTD., Jiangsu (CN)

(72) Inventors: Xueyan Wang, Jiangsu (CN); Weiyan Zhang, Jiangsu (CN); Qiang Chen, Jiangsu (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 0 days.

(21) Appl. No.: 15/565,191

(22) PCT Filed: Jan. 29, 2016

(86) PCT No.: PCT/CN2016/072813
§ 371 (c)(1),
(2) Date: Oct. 30, 2017

(87) PCT Pub. No.: WO2016/161839
PCT Pub. Date: Oct. 13, 2016

(65) Prior Publication Data
US 2018/0175804 A1 Jun. 21, 2018

(30) Foreign Application Priority Data
Apr. 10, 2015 (CN) .......................... 2015 1 0171099

(51) Int. Cl.
H03F 3/45 (2006.01)
H03F 1/26 (2006.01)

(52) U.S. Cl.
CPC .......... *H03F 1/26* (2013.01); *H03F 3/45475* (2013.01); *H03F 2200/165* (2013.01); *H03F 2203/45514* (2013.01)

(58) Field of Classification Search
CPC ........................................................ H03F 3/45
(Continued)

(56) References Cited

U.S. PATENT DOCUMENTS 6,914,479 B1 7/2005 Gabillard et al.
7,589,587 B2 * 9/2009 Yoshida .................. H03F 3/387
330/258

(Continued)

FOREIGN PATENT DOCUMENTS

CN 101834573 A 9/2010
CN 102429748 A 5/2012
CN 102809671 A 12/2012

OTHER PUBLICATIONS

International Search Report dated Apr. 27, 2016 issued in corresponding International Application No. PCT/CN2016/072813, 5 Pages.

*Primary Examiner* — Henry Choe
(74) *Attorney, Agent, or Firm* — Polsinelli PC (57) ABSTRACT

A signal amplification circuit comprises a low pass filter circuit (100). The low pass filter circuit (100) comprises two input ends and two output ends and further comprises two capacitors (C1, C2) having opposite polarities respectively connected between two output ends. A buffer circuit (200) comprises two input ends, a first operational amplifier (A1) and a second operational amplifier (A2), two output ends and a plurality of switches. A switched capacitor integrated circuit (300) comprises two input ends, a third operational amplifier (A3), a plurality of capacitor modules, a plurality of chopper modulators and two output ends. A signal switch (S) is used to control the on and off states of voltage signal before amplification.

10 Claims, 11 Drawing Sheets (58) Field of Classification Search
USPC .................................................. 330/260, 9
See application file for complete search history.

(56) References Cited

U.S. PATENT DOCUMENTS

| | | | | |
|---|---|---|---|---|
| 8,179,195 | B1* | 5/2012 | Huijsing | H03F 3/38 |
| | | | | 330/124 R |
| 8,319,550 | B2* | 11/2012 | Prasad | H03F 1/0205 |
| | | | | 330/254 |
| 8,390,372 | B2* | 3/2013 | Buter | H03F 3/005 |
| | | | | 330/9 |
| 2008/0204148 | A1 | 8/2008 | Kim et al. | |
| 2011/0318015 | A1 | 12/2011 | Sugimoto | |

* cited by examiner

SIGNAL AMPLIFICATION CIRCUIT

CROSS REFERENCE TO RELATED APPLICATIONS

This application is a National Phase filing under 35 U.S.C. § 371 of PCT/CN2016/072813 filed on Jan. 29, 2016 and this application claims priority to Chinese Application No. 201510171099.6 filed on Apr. 10, 2015 under 35 U.S.C. § 119. The entire contents of each application are hereby incorporated by reference.

FIELD OF THE INVENTION

The present disclosure relates to the field of signal processing, and particularly relates to a signal amplification circuit.

BACKGROUND OF THE INVENTION

A micro-electro-mechanical system (MEMS) accelerometer is an accelerometer fabricated using MEMS technology. With advantages such as small size, light weight, and low power consumption, the MEMS accelerometer is widely applied to vibration detection, azimuth detection, consumer application, motion recognition, and other fields.

A piezoresistive accelerometer is fabricated using the piezoelectric effect of lead zirconate titanate (PZT). When the PZT is under pressure, a resistance value of the PZT changes. By a bridge connection of piezoresistors, a change in resistance value is converted to be a change in voltage. After detection, amplification, and correction, a binary digital signal corresponding to an acceleration value is outputted. An induced voltage signal outputted by the accelerometer is generally around a few millivolts or tens of millivolts, which is very weak. And if it is directly inputted into an analog-to-digital circuit (ADC), then a dynamic range of an output will be low, and an accuracy of the output declines. Therefore, the induced voltage signal must be amplified before being inputted into the ADC, and finally an accurate digital signal corresponding to the induced voltage is obtained.

An analog front-end (readout circuit) of a conventional accelerometer generally consists of an amplification circuit and an ADC. Noise of a harmonic frequency of a control clock signal is introduced into the system, meanwhile, there is much noise of low frequencies in the environment (for example, a sound signal), if not filtered, a detected acceleration signal will be affected. If a filter circuit is introduced, resistors and capacitors applied to a filter capacitor will lead to an oversized a chip. A sensor is in a working state all through a signal processing process, which results in a great power consumption.

The front-end amplification circuit does not remove low-frequency 1/f noise or an input offset voltage, or use a buffer circuit having a large capacitor and based on Auto-Zero technology and correlated double sampling (CDS), which results in a large area of the circuit, and makes the circuit not easy to be integrated.

1/f noise and the input offset voltage of the amplification circuit itself are amplified a same ratio as the signal, therefore a signal-to-noise ratio decreased, and dynamic performance declined. The amplification circuit has a fixed gain, such that for different ranges of sensors, resolution for small signals is not enough.

SUMMARY OF THE INVENTION

Accordingly, it is necessary to provide a signal amplification circuit with small circuit area, low power consumption, good noise suppression and variable gain.

A signal amplification circuit includes:

a low-pass filter circuit including a first input terminal, a second input terminal, a first switch, a second switch, a first rheostat, a second rheostat, a first capacitor, a second capacitor, a first output terminal, and a second output terminal; the first input terminal is connected to the first output terminal via the first switch and the first rheostat, the second input terminal is connected to the second output terminal via the second switch and the second rheostat; the first capacitor and the second capacitor are connected between the first output terminal and the second output terminal, respectively, with their polarity opposite to each other;

a buffer circuit including a third input terminal, a fourth input terminal, a first operational amplifier (op-amp), a second op-amp, a third switch, a fourth switch, a fifth switch, a sixth switch, a seventh switch, an eighth switch, a ninth switch, a tenth switch, an eleventh switch, a twelfth switch, a thirteenth switch, a fourteenth switch, a third output terminal, and a fourth output terminal; the third input terminal is connected to a positive input terminal of the first op-amp via the third switch, and the third input terminal is connected to a negative input terminal of the first op-amp via the fourth switch; the positive output terminal of the first op-amp is connected to the third output terminal via the fifth switch, and the negative output terminal of the first op-amp is connected to the third output terminal via the sixth switch; the positive input terminal of the first op-amp is connected to the negative output terminal of the first op-amp via the seventh switch, and the negative input terminal of the first op-amp is connected to the positive output terminal of the first op-amp via the eighth switch; the fourth input terminal is connected to a positive input terminal of the second op-amp via the ninth switch, and the fourth input terminal is connected to a negative input terminal of the second op-amp via the tenth switch; the positive output terminal of the second op-amp is connected to the fourth output terminal via the eleventh switch, and the negative output terminal of the second op-amp is connected to the fourth output terminal via the twelfth switch; the positive input terminal of the second op-amp is connected to the negative output terminal of the second op-amp via the thirteenth switch, and the negative input terminal of the second op-amp is connected to the positive output terminal of the second op-amp via the fourteenth switch;

a switched-capacitor integrator circuit including a fifth input terminal, a sixth input terminal, a third op-amp, a first switched capacitor module, a second switched capacitor module, a third switched capacitor module, a fourth switched capacitor module, a first capacitor module, a second capacitor module, a first chopper modulator, a second chopper modulator, a third chopper modulator, a fifth output terminal, and a sixth output terminal; each of the switched capacitor modules includes a capacitor and at least four switches, which form a switched capacitor structure; each of the capacitor modules includes an adjustable capacitor and at least one switch, and the capacitor and the switch are connected in parallel; each of the chopper modulators includes at least four switches which form a chopping modulating structure; the fifth input terminal is connected to a positive input terminal of the third op-amp sequentially via the first switched capacitor module and the first chopper modulator, and the sixth input terminal is connected to a negative input terminal of the third op-amp sequentially via the second switched capacitor module and the first chopper modulator; the positive input terminal of the third op-amp is connected to the fifth output terminal sequentially via the second chopper modulator and the first capacitor module, and the negative input terminal of the third op-amp is connected to the sixth output terminal sequentially via the second chopper modulator and the second capacitor module; the positive input terminal of the third op-amp is connected to the fifth output terminal via the third switched capacitor module, and the negative input terminal of the third op-amp is connected to the sixth output terminal via the fourth switched capacitor module; the positive output terminal of the third op-amp is connected to the sixth output terminal via the third chopper modulator, and the negative output terminal of the third op-amp is connected to the fifth output terminal via the third chopper modulator; and a signal switch used to control on or off of a voltage signal before amplification; the first input terminal and the second input terminal input the voltage signal before amplification; the first output terminal is connected to the third input terminal, the second output terminal is connected to the fourth input terminal, the third output terminal is connected to the fifth input terminal, and the fourth output terminal is connected to the sixth input terminal; the fifth output terminal and the sixth output terminal output an amplified voltage signal.

The aforementioned signal amplification circuit can divide the operation state of the circuit by controlling switch signals, and the opening or closing of the first switch and the second switch, such that the power consumption is reduced, with same sizes of resistors and capacitors a low bandwidth is achieved, and not only is the bandwidth flexible to control, while an area and power consumption are reduced, but also the noise suppression is better. Choosing an adjustable resistor and increasing a bandwidth adjustable range make the signal amplification circuit have enough resolution for small signals of different ranges. The first capacitor and the second capacitor are connected between the first output terminal and the second output terminal, respectively, with their polarity opposite to each other, thus noise introduced into a layout design can be effectively suppressed.

BRIEF DESCRIPTION OF THE DRAWINGS

The accompanying drawings are herein as part of the present disclosure for providing a thorough understanding of the present disclosure. Embodiments of the disclosure are described more fully hereinafter with reference to the accompanying drawings to explain the principles of the present disclosure. In which.

DETAILED DESCRIPTION OF THE EMBODIMENTS

Embodiments of the disclosure are described more fully hereinafter with reference to the accompanying drawings. The various embodiments of the disclosure may, however, be embodied in many different forms and should not be construed as limited to the embodiments set forth herein. Rather, these embodiments are provided so that this disclosure will be thorough and complete, and will fully convey the scope of the disclosure to those skilled in the art.

Unless otherwise defined, all terms (including technical and scientific terms) used herein have the same meaning as commonly understood by one of ordinary skill in the art to which this disclosure belongs. The terms used herein in the specification of the present disclosure are for the purpose of describing the embodiments only and are not intended to limit the invention. As used herein, the term "and/or" includes any and all combinations of one or more of the associated listed items.

In the following descriptions, all switches are semiconductor device switches and are controlled by a plurality of sets of switch signals. A symbol 1 represents the switch control signal of each switch, respectively.

Figure 1:
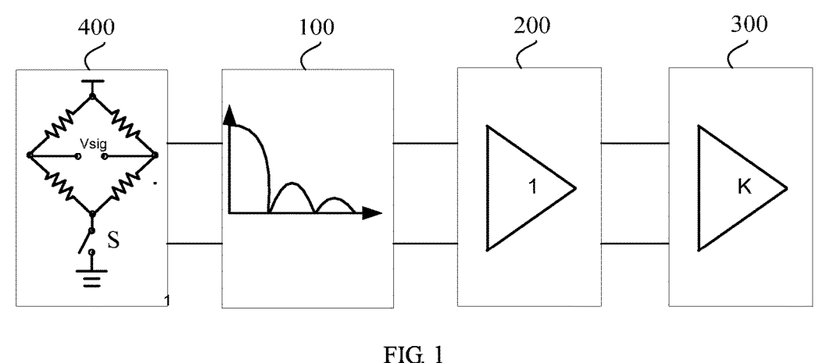
FIG. 1 is a block diagram of a signal amplification circuit according to an embodiment.

FIG. 1 is a block diagram of a signal amplification circuit according to an embodiment.

Referring to FIG. 1, the signal amplification circuit includes a low-pass filter circuit 100, a buffer circuit 200, a switched-capacitor integrator circuit 300, a sensor 400, a signal switch S, a first connecting switch S1, a second connecting switch S2, a third connecting switch S3, and a fourth connecting switch S4. The first connecting switch S1, the second connecting switch S2, the third connecting switch S3, and the fourth connecting switch S4 are not shown in FIG. 1.

Figure 2:
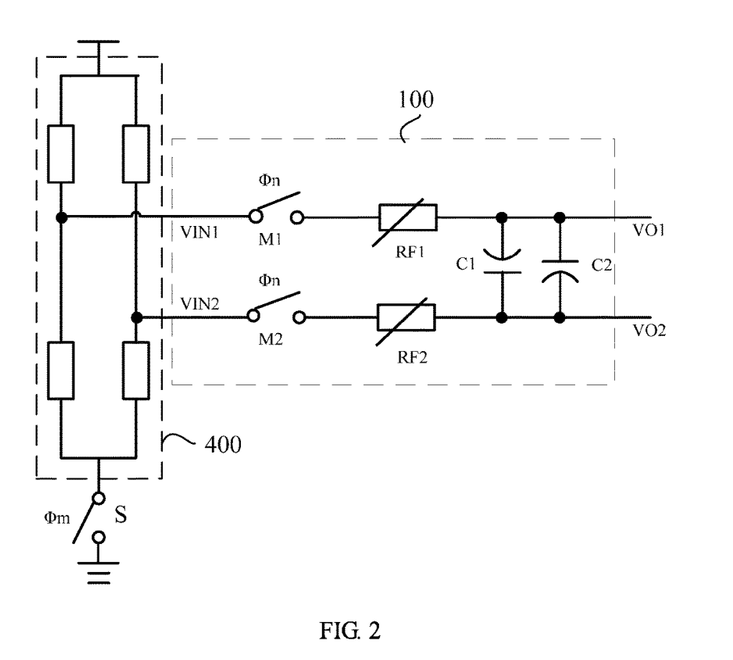
FIG. 2 is a schematic diagram illustrating a sensor and a low-pass filter circuit connected thereto according to an embodiment.

FIG. 2 is a schematic diagram illustrating a sensor and a low-pass filter circuit connected thereto according to an embodiment.

Referring to FIG. 2, the low-pass filter circuit 100 includes a first input terminal VIN1, a second input terminal VIN2, a first switch M1, a second switch M2, a first rheostat RF1, a second rheostat RF2, a first capacitor C1, a second capacitor C2, a first output terminal VO1, and a second output terminal VO2.

The first input terminal VIN1 is connected to the first output terminal VO1 via the first switch M1 and the first rheostat RF1, the second input terminal VIN2 is connected to the second output terminal VO2 via the second switch M2 and the second rheostat RF2; the first capacitor C1 and the second capacitor C2 are connected between the first output terminal VO1 and the second output terminal VO2, respectively, with their polarity opposite to each other (the polarity of upper and lower plates of one capacitor is in contrast to the polarity of upper and lower plates of the other, respectively).

In a discrete system, the detection and amplification of the signal are achieved by switched capacitor cyclically sampling. In order to avoid introducing noise of a harmonic frequency of a control clock signal into the system, it is necessary to firstly filter the signal using an anti-aliasing filter (AAF). Meanwhile, there is much noise of low frequencies in the environment, for example, a sound signal, if the noise is not filtered, the detected acceleration signal will be affected. Therefore, the low-pass filter circuit is used to increase resolution of the system before signal detection and amplification.

Figure 3:
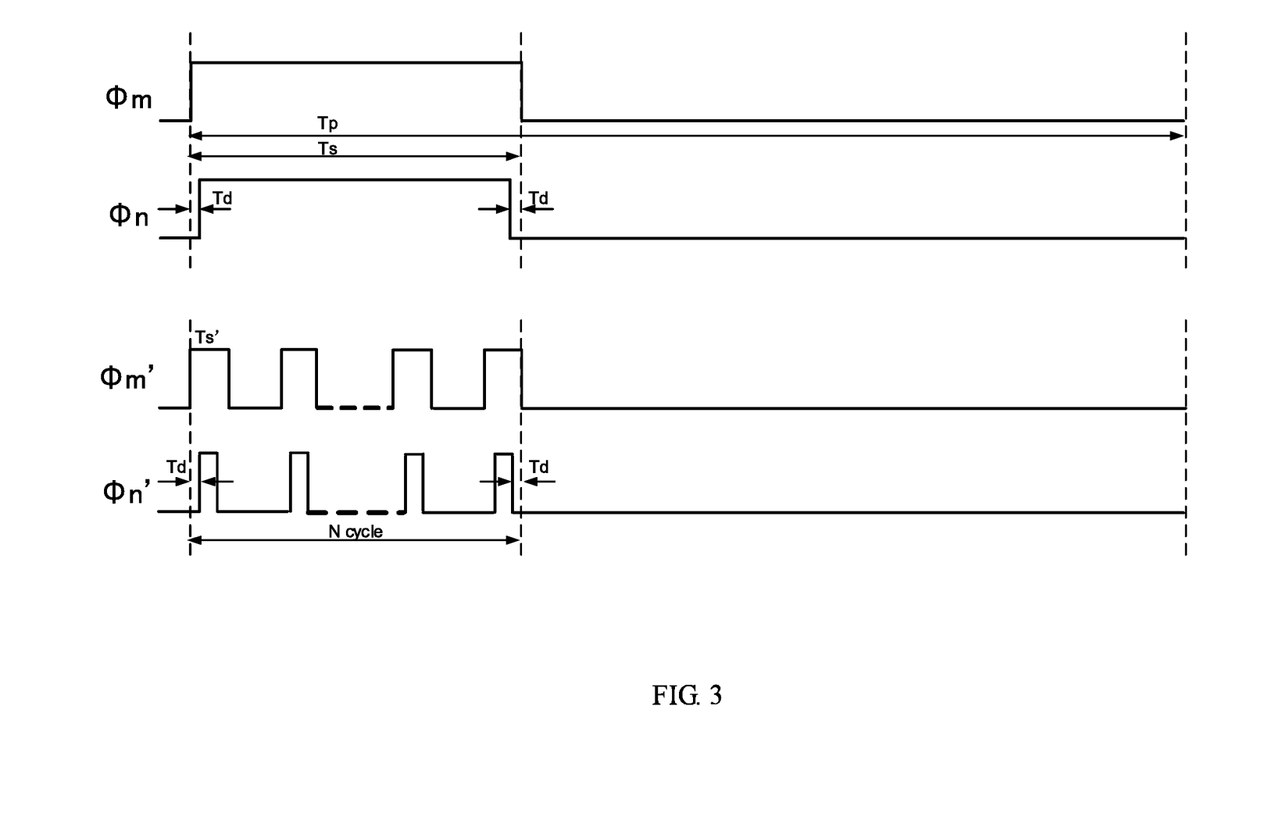
FIG. 3 is a timing diagram of a switch control signal of a signal switch and switch control signals of a first switch and a second switch in one cycle according to an embodiment.

FIG. 3 is a timing diagram of a switch control signal of a signal switch, and switch control signals of a first switch and a second switch according to an embodiment.

Referring to FIG. 3, the switch control signal of the signal switch S is $\Phi m$, and the switch control signals of the first switch M1 and the second switch M2 are both $\Phi n$. The cyclic pulse signals $\Phi m$ and $\Phi n$ control the operation of the sensor 400 and the low-pass filter circuit 100, respectively, thus power consumption is reduced, and a lower bandwidth is achieved with the same resistance and capacitance. Ts is an opening time of the signal switch S in the cycle Tp, and a duty cycle (Ts/Tp) of the pulse affects the actual bandwidth. The lower the duty cycle is, the smaller the resistance and capacitance values used to achieve the same bandwidth are, therefore an area and power consumption are smaller.

Alternatively, the opening time $T_s$ can be divided into N sections, i.e., $N \times T'_s = T_s$. A rising edge of the control signal $\Phi m$ leads a rising edge of the control signal Td, and a falling edge of the control signal $\Phi m$ lags a falling edge Td of the control signal $\Phi n$. The bandwidth is determined by the opening time Ts of a switch and the cycle time Tp.

Using the series connection and the parallel connection of the first rheostat RF1 and the second rheostat RF2, a resistance change is achieved, such that the bandwidth of the filter is changed. The first capacitor C1 and the second capacitor C2 are two capacitors that the polarity of the upper and lower plates of one capacitor is in contrast to the polarity of upper and lower plates of the other, respectively; capacitance of the first capacitor C1 and the second capacitor C2 can be equal. Output differential terminals in the layout can be symmetrical, which is conducive to common mode (CM) noise suppression.

Figure 4:
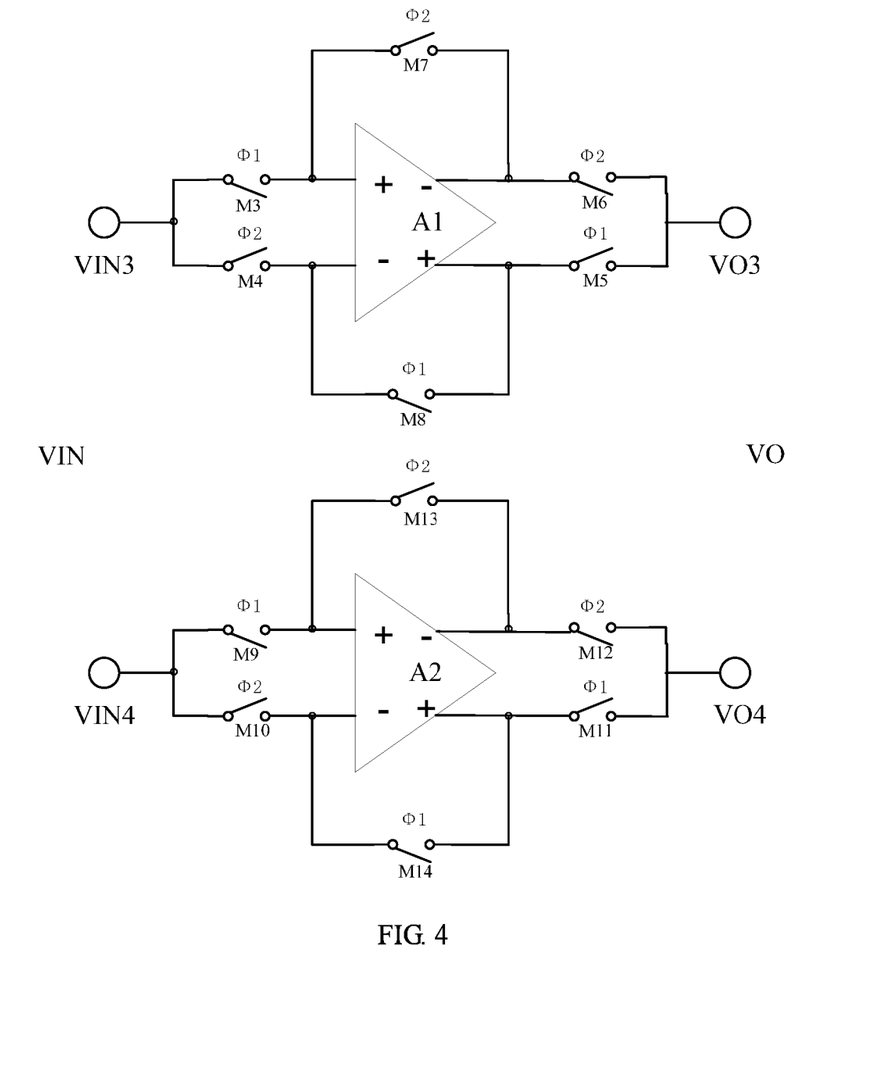
FIG. 4 is a schematic diagram of a buffer circuit according to an embodiment.

FIG. 4 is a schematic diagram of a buffer circuit according to an embodiment.

Referring to FIG. 4, the buffer circuit 200 includes a third input terminal VIN3, a fourth input terminal VIN4, a first op-amp A1, a second op-amp A2, a third switch M3, a fourth switch M4, a fifth switch M5, a sixth switch M6, a seventh switch M7, an eighth switch M8, a ninth switch M9, a tenth switch M10, an eleventh switch M11, a twelfth switch M12, a thirteenth switch M13, a fourteenth switch M14, a third output terminal VO3, and a fourth output terminal VO4.

The third input terminal VIN3 is connected to a positive input terminal of the first op-amp A1 via the third switch M3, and the third input terminal VIN3 is connected to a negative input terminal of the first op-amp A1 via the fourth switch M4; the positive output terminal of the first op-amp A1 is connected to the third output terminal VO3 via the fifth switch M5, and the negative output terminal of the first op-amp A1 is connected to the third output terminal VO3 via the sixth switch M6; the positive input terminal of the first op-amp A1 is connected to the negative output terminal of the first op-amp A1 via the seventh switch M7, and the negative input terminal of the first op-amp A1 is connected to the positive output terminal of the first op-amp A1 via the eighth switch M8.

The fourth input terminal VIN4 is connected to a positive input terminal of the second op-amp A2 via the ninth switch M9, and the fourth input terminal VIN4 is connected to a negative input terminal of the second op-amp A2 via the tenth switch M10; the positive output terminal of the second op-amp A2 is connected to the fourth output terminal VO4 via the eleventh switch M11, and the negative output terminal of the second op-amp A2 is connected to the fourth output terminal VO4 via the twelfth switch M12; the positive input terminal of the second op-amp A2 is connected to the negative output terminal of the second op-amp A2 via the thirteenth switch M13, and the negative input terminal of the second op-amp A2 is connected to the positive output terminal of the second op-amp A2 via the fourteenth switch M14.

Figure 5:
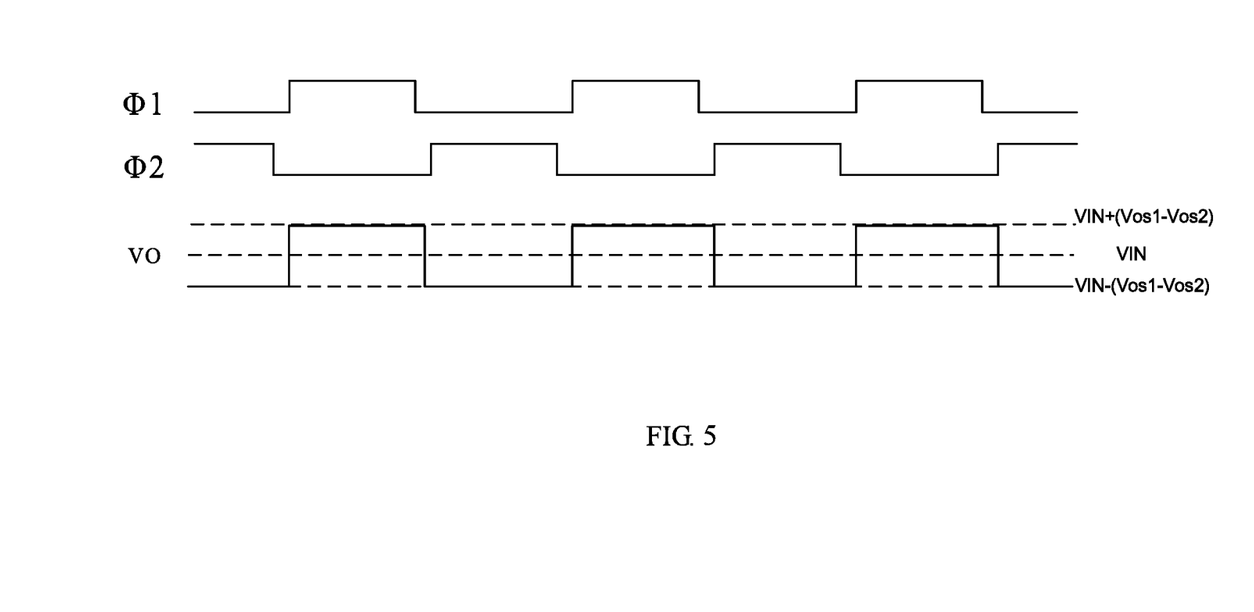
FIG. 5 is a timing diagram of a switch control signal and an output signal in a buffer circuit according to an embodiment.

FIG. 5 is a timing diagram of a switch control signal and an output signal in a buffer circuit according to an embodiment.

Referring to FIG. 5, the switch control signals of the third switch M3, the fifth switch M5, the eighth switch M8, the ninth switch M9, the eleventh switch M11, and the fourteenth switch M14 are $\Phi 1$; the switch control signals of the fourth switch M4, the sixth switch M6, the seventh switch M7, the tenth switch M10, the twelfth switch M12, and the thirteenth switch M13 are $\Phi 2$. $\Phi 1$ and $\Phi 2$ are two antiphase no-overlap clock signals. The two clock signals keep switching from each other, and the signal keep switching between the positive input terminal and the negative input terminal of the op-amp, which is a special case of chopping technology.

Vos1 and Vos2 represent a low frequency 1/f noise and offset of the op-amp, as shown in FIG. 5, modulated by a high frequency chopping clock signal to a high frequency. VO is a cycle signal of which a frequency is the same as $\Phi 1$, a DC component is VIN, and a signal amplitude is Vos1-Vos2. A post-stage amplification circuit (the switched-capacitor integrator circuit 300) can remove Vos1 and Vos2 by integrating VOUT, such that low-frequency noise is reduced and the signal-to-noise ratio of the system is improved. Compared with the Auto-Zero technology and CDS technology, as capacitor is not used herein, the area is significantly saved. A noise performance of the system is improved because no noise is introduced. The amplifier itself is a low noise structure, thus high frequency thermal noise is very small.

Figure 6:
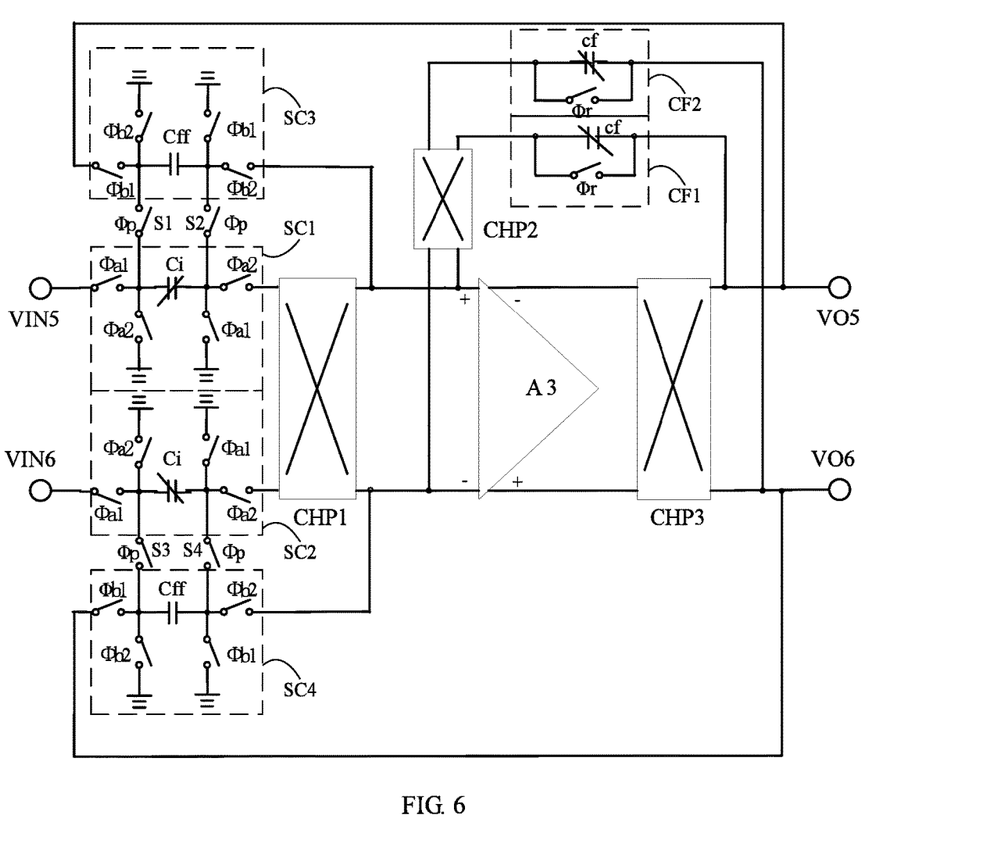
FIG. 6 is a schematic diagram of a switched-capacitor integrator circuit according to an embodiment.
Figure 7:
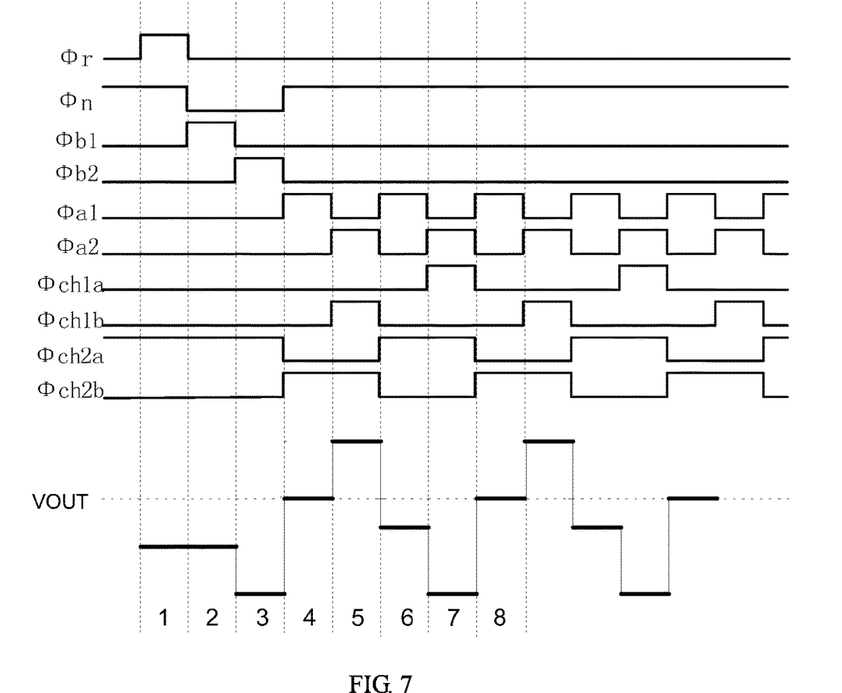
FIG. 7 is a timing diagram of each of the signals in a switched-capacitor integrator circuit according to an embodiment.

FIG. 6 is a schematic diagram of a switched-capacitor integrator circuit according to an embodiment; FIG. 7 is a timing diagram of each of the signals in a switched-capacitor integrator circuit according to an embodiment.

Referring to FIG. 6 and FIG. 7, the switched-capacitor integrator circuit 300 includes a fifth input terminal VIN5, a sixth input terminal VIN6, a third op-amp A3, a first switched capacitor module SC1, a second switched capacitor module SC2, a third switched capacitor module SC3, a fourth switched capacitor module SC4, a first capacitor module CF1, a second capacitor module CF2, a first chopper modulator CHP1, a second chopper modulator CHP2, a third chopper modulator CHP3, a fifth output terminal VO5, and a sixth output terminal VO6.

Each of the switched capacitor modules (the first switched capacitor module SC1, the second switched capacitor module SC2, the third switched capacitor module SC3, and the fourth switched capacitor module SC4) includes a capacitor and at least four switches, which form a switched capacitor structure. In the present embodiment, each of the switched capacitor modules includes the capacitor, a first control switch, a second control switch, a third control switch, and a fourth control switch. A first plate of the capacitor is connected to an input terminal of the switched capacitor module via the first control switch, and the first plate of the capacitor is further connected to ground via the second control switch. A second plate of the capacitor is connected to an output terminal of the switched capacitor module via the third control switch, and the second plate of the capacitor is further connected to the ground via the fourth control switch.

Capacitance of the first switched capacitor module SC1 and capacitance of the second switched capacitor module SC2 are both Ci, and both are represented by Ci. The switch control signals of the first control switch and the fourth control switch of the first switched capacitor module SC1 and the second switched capacitor module SC2 are Φa1; the switch control signals of the second control switch and the third control switch of the first switched capacitor module SC1 and the second switched capacitor module SC2 are Φa2. Φa1 and Φa2 are two antiphase no-overlap clock signals.

Capacitance of the third switched capacitor module SC3 and capacitance of the fourth switched capacitor module SC4 are both Cff, and both are represented by Cff. The switch control signals of the first control switch and the fourth control switch of the third switched capacitor module SC3 and the fourth switched capacitor module SC4 are Φb1; the switch control signals of the second control switch and the third control switch of the third switched capacitor module SC3 and the fourth switched capacitor module SC4 are Φb2.

Figure 8:
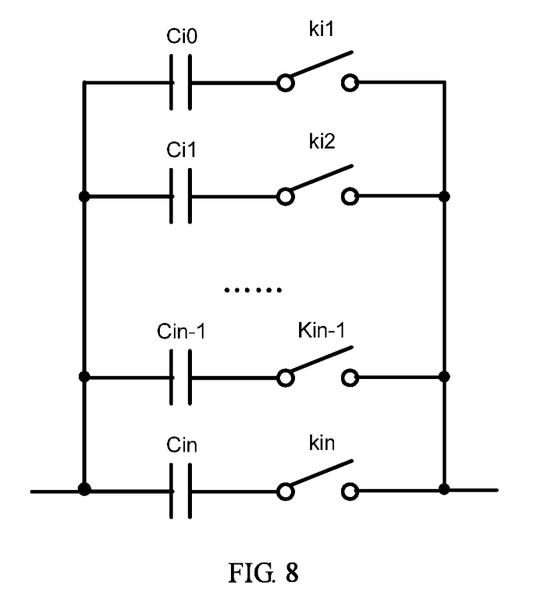
FIG. 8 is a schematic diagram of an adjustable capacitor in a first switched capacitor module or a second switched capacitor module according to an embodiment.

FIG. 8 is a schematic diagram of an adjustable capacitor in a first switched capacitor module or a second switched capacitor module according to an embodiment. Referring to FIG. 8, the capacitors in the first switched capacitor module SC1 and the second switched capacitor module SC2 are adjustable capacitors Ci. The adjustable capacitor Ci includes a plurality of capacitors (Ci0, Ci1 . . . Cin) and a plurality of switches (ki0, ki1 . . . kin). Each of the plurality of capacitors (Cin) and each of the plurality of switches (kin) are connected in series to form a capacitor branch, and all capacitor branches are connected in parallel. The capacitor branch switch is opened or closed to introduce a capacitor, thus adjustable capacitance is achieved.

The switches (ki0, ki1 . . . kin) of the adjustable capacitor in the first switched capacitor module SC1 is adjacent to an output terminal of the first switched capacitor module SC1, and the switches (ki0, ki1 . . . kin) of the adjustable capacitor in the second switched capacitor module SC2 is adjacent to an output terminal of the second switched capacitor module SC2. A voltage across a switch affects a resistance thereof, thus the switch must be adjacent to an input terminal of an op-amp (for the first switched capacitor module SC1, it means the output terminal of the first switched capacitor module SC1; for the second switched capacitor module SC2, it means the output terminal of the second switched capacitor module SC2). Even if an input signal changes, the input terminal of the op-amp remains approximate to a CM electrical level. The voltage across the switch is not affected, thus characteristics of the switch is not changed, and a magnification is not affected.

Both ends of the capacitor Ci in the first switched capacitor module SC1 are connected in parallel with both ends of the capacitor Cff in the third switched capacitor module SC3 via the first connecting switch S1 and the second connecting switch S2, respectively; both ends of the capacitor Ci in the second switched capacitor module SC2 are connected in parallel with both ends of the capacitor Cff in the fourth switched capacitor module SC4 via the third connecting switch S3 and the fourth connecting switch S4, respectively. The switch control signal of the first connecting switch S1, the second connecting switch S2, the third connecting switch S3, and the fourth connecting switch S4 are Φp.

Figure 9:
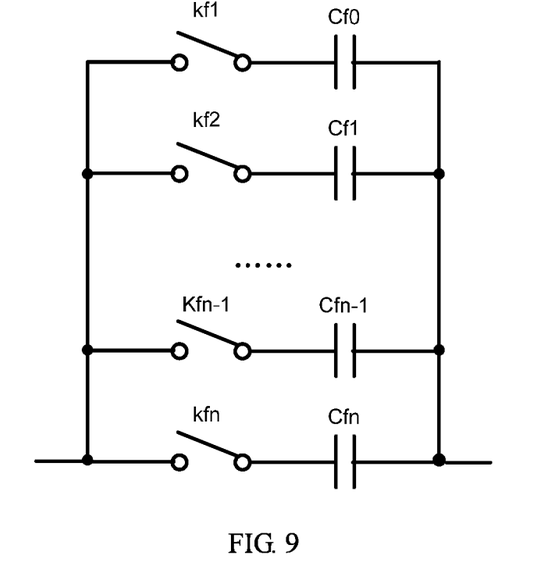
FIG. 9 is a schematic diagram of an adjustable capacitor in a first capacitor module or a second capacitor module according to an embodiment.

FIG. 9 is a schematic diagram of an adjustable capacitor in a first capacitor module or a second capacitor module according to an embodiment. As shown in FIG. 9, each capacitor module (the first capacitor module CF1 and the second capacitor module CF2) includes an adjustable capacitor Cf and one switch (represented by its control signal Φr), and the adjustable capacitor Cf and the switch Φr is connected in parallel. The adjustable capacitor Cf can include a plurality of capacitors (Cf0, Cf1 . . . Cfn) and a plurality of switches (kf0, kf1 . . . kfn). Each of the plurality of capacitors (Cfn) and each of the plurality of switches (kfn) are connected in series to form a capacitor branch, and all capacitor branches are connected in parallel. The capacitor branch switch is opened or closed to introduce a capacitor, thus adjustable capacitance is achieved. As mentioned above, the switch (kf0, kf1 . . . kfn) of the adjustable capacitor Cf in the capacitor module is adjacent to the input terminal of the capacitor module (equals to the input terminal of the op-amp).

Figure 10:
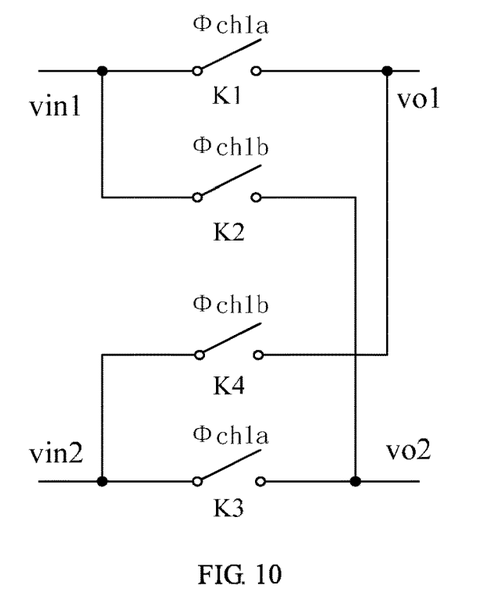
FIG. 10 is a schematic diagram of a first chopper modulator according to an embodiment.
Figure 11:
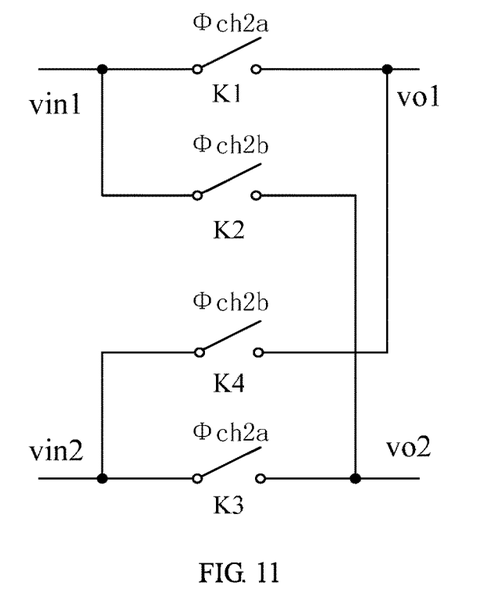
FIG. 11 is a schematic diagram of a second chopper modulator or a third chopper modulator according to an embodiment.
Figure 12:
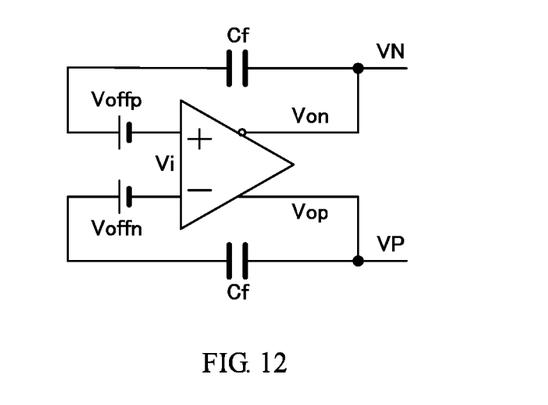
FIG. 12 to FIG. 19 are diagrams illustrating states of the switched-capacitor integrator circuit under the control of the signals illustrated in FIG. 7.
Figure 13:
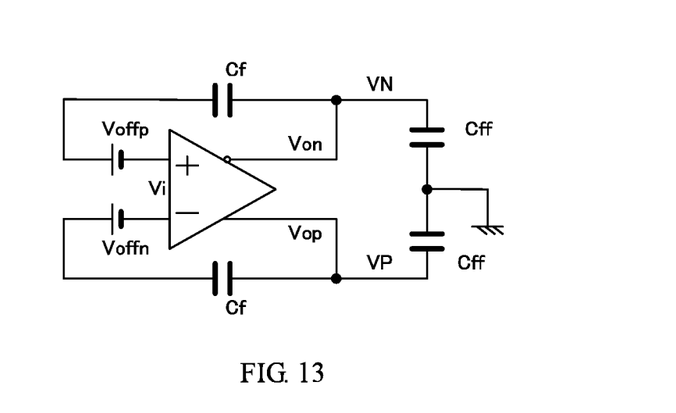
Figure 14:
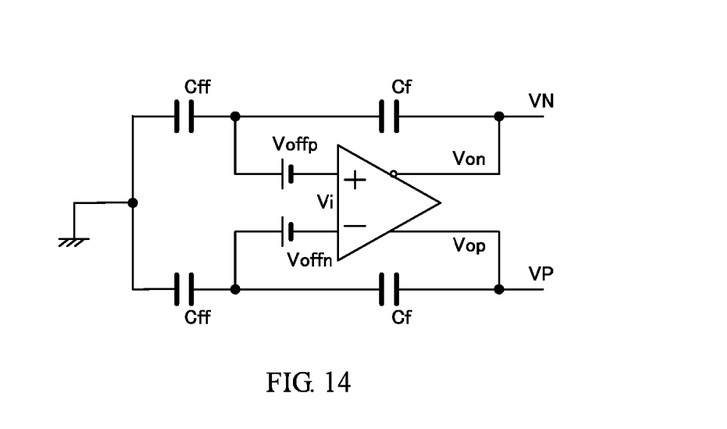
Figure 15:
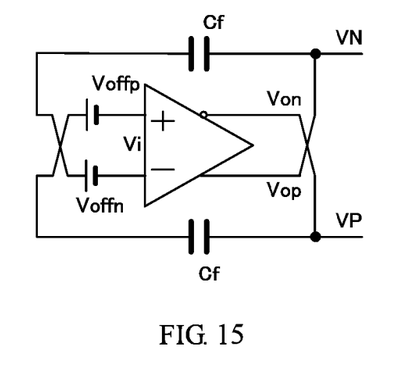
Figure 16:
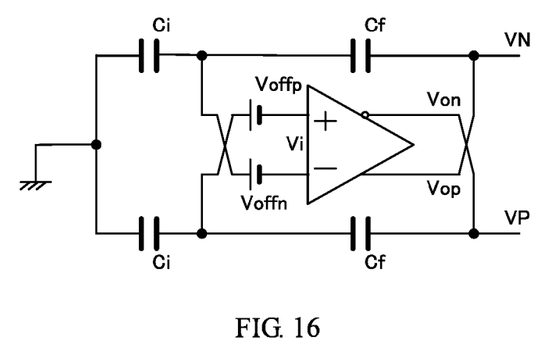
Figure 17:
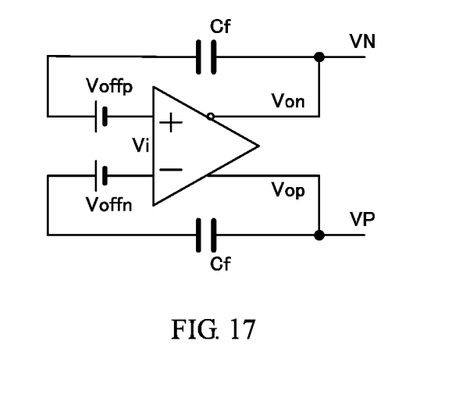
Figure 18:
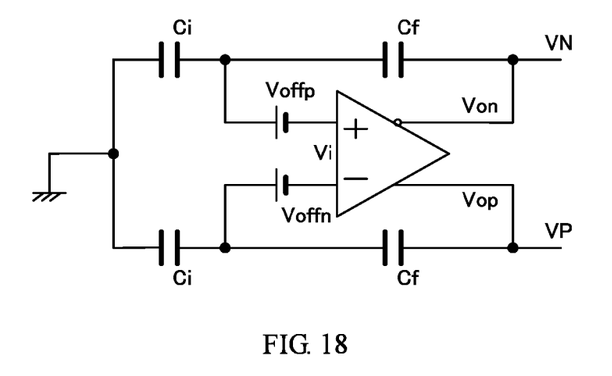
Figure 19:
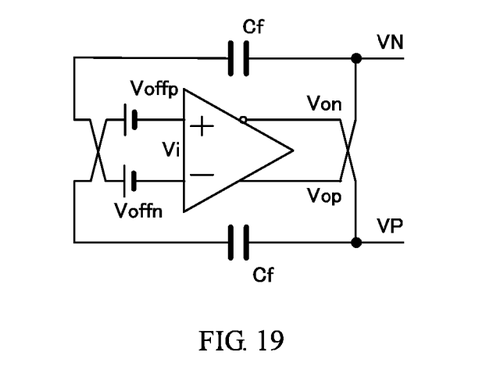

Each chopper modulator (the first chopper modulator CHP1, the second chopper modulator CHP2, and the third chopper modulator CHP3) includes at least four switches which form a chopping modulating structure. In the present embodiment, each chopper modulator includes four switches which form a chopping modulating structure. The chopper modulator includes a first chopper switch K1, a second chopper switch K2, a third chopper switch K3, and a fourth chopper switch K4. A first input terminal vin1 of the chopper modulator is connected to a first output terminal vo1 of the chopper modulator via the first chopper switch K1, and the first input terminal vin1 of the chopper modulator is connected to a second output terminal vo2 of the chopper modulator via the second chopper switch K2. A second input terminal vin2 of the chopper modulator is connected to the second output terminal vo2 of the chopper modulator via the third chopper switch K3, and the second input terminal vin2 of the chopper modulator is connected to the first output terminal vo1 of the chopper modulator via the fourth chopper switch K4.

FIG. 10 is a schematic diagram of a first chopper modulator according to an embodiment; FIG. 11 is a schematic diagram of a second chopper modulator or a third chopper modulator according to an embodiment. As shown in FIG. 10 and FIG. 11, the switch control signals of the switch K1 and switch K3 of the first chopper modulator CHP1 are Φch1a, and the switch control signals of the switch K2 and switch K4 of the first chopper modulator CHP1 are Φch1b. Φch1a and Φch1b are two antiphase no-overlap clock signals. The switch control signals of the switch K1 and switch K3 of the second chopper modulator CHP2 are Φch2a, and the switch control signals of the switch K2 and switch K4 of the second chopper modulator CHP2 are Φch2b. Φch2a and Φch2b are two antiphase no-overlap clock signals.

The fifth input terminal VIN5 is connected to a positive input terminal of the third op-amp A3 sequentially via the first switched capacitor module SC1 and the first chopper modulator CHP1, and the sixth input terminal VIN6 is connected to a negative input terminal of the third op-amp A3 sequentially via the second switched capacitor module SC2 and the first chopper modulator CHP1. The positive input terminal of the third op-amp A3 is connected to the fifth output terminal VO5 sequentially via the second chopper modulator CHP2 and the first capacitor module CF1, and the negative input terminal of the third op-amp A3 is connected to the sixth output terminal VO6 sequentially via the second chopper modulator CHP2 and the second capacitor module CF2. The positive input terminal of the third op-amp A3 is connected to the fifth output terminal VO5 via the third switched capacitor module SC3, and the negative input terminal of the third op-amp A3 is connected to the sixth output terminal VO6 via the fourth switched capacitor module SC4. The positive output terminal of the third op-amp A3 is connected to the sixth output terminal VO6 via the third chopper modulator CHP3, and the negative output terminal of the third op-amp A3 is connected to the fifth output terminal VO5 via the third chopper modulator CHP3.

FIG. 12 to FIG. 19 are diagrams illustrating states of the switched-capacitor integrator circuit under the control of the signals illustrated in FIG. 7, and are corresponding to states 1 to 8, respectively. Voffp and Voffn are the deviation voltages of the positive input terminal of the op-amp and the negative input terminal of the op-amp, respectively. State1 and state2: $VP-VN=-(Voffp-Voffn)$; state 3: $VP-VN=Voffn \times (2 \times Cff/Cf+1) - Voffp \times (2 \times Cff/Cf+1)$; state 4: $VP-VN=(2 \times Cff/Cf-1) \times (Voffn-Voffp)$, and when $Cff=\frac{1}{2} \times Cf$, an output is zero; state 5: $VP-VN=Ci/Cf \times (Voffp-Voffn)$; state 6: $VP-VN=(Ci/Cf-2) \times (Voffp-Voffn)$; state 7: $VP-VN=2 \times (Voffn-Voffp)$; state 8: $VP-VN=0$. The process of state 5 to state 8 will continue to repeat after the state 8. A selected integration cycle should ensure that when there is no input signal, the output is zero, thus removing the amplifier offset and 1/flow frequency noise.

The signal switch S is used to control on or off of a voltage signal before amplification. The first input terminal VIN1 and the second input terminal VIN2 input the voltage signal before amplification. The first output terminal VO1 is connected to the third input terminal VIN3; the second output terminal VO2 is connected to the fourth input terminal VIN4; the third output terminal VO3 is connected to the fifth input terminal VIN5; and the fourth output terminal VO4 is connected to the sixth input terminal VIN6. The fifth output terminal VO5 and the sixth output terminal VO6 output an amplified voltage signal. Specifically, the sensor 400 is connected to ground via the signal switch S, and is further connected to the first input terminal VIN1 and second input terminal VIN2 of the low-pass filter circuit 100. The sensor 400 uses a resistance change of its own to output a differential output voltage as the voltage signal before amplification. In the present embodiment, the sensor 400 is an acceleration sensor composed of a Wheatstone bridge circuit using a varistor element.

The aforementioned signal amplification circuit can be applied to intelligent digital devices, such as mobile phones or tablet computers.

The aforementioned signal amplification circuit can divide the operation state of the circuit by controlling switch signals, and the opening or closing of the first switch and the second switch, such that the power consumption is reduced, with the same sizes of resistors and capacitors a low bandwidth is achieved, and not only is the bandwidth flexible to control, while an area and power consumption are reduced, but also the noise suppression is better. Choosing the adjustable resistor and increasing the bandwidth adjustable range make the signal amplification circuit have enough resolution for small signals of different ranges. The first capacitor and the second capacitor are connected between the first output terminal and the second output terminal, respectively, with their polarity opposite to each other, thus noise introduced into a layout design can be effectively suppressed.

A differential buffer circuit is composed by two op-amps (the first op-amp and the second op-amp), thus it is ensured that charges stored on the filter capacitor are not affected, even though the post-stage amplification circuit samples for a lot of times. The chopping technology can be applied to a structure of the buffer circuit. The 1/f noise and the input offset voltage can be removed by controlling the opening and closing of the switch in the buffer circuit. Without using capacitors, an area of the chip is reduced, and noise becomes smaller.

The switched-capacitor integrator circuit removes the input offset voltage of the amplifier and reduces the 1/f noise basically using the chopping technology and the Auto-Zero technology and by controlling the opening or closing of the switches. Meanwhile, not only can the gain be changed by changing the integration cycle, but also the gain can be adjustable by adjusting a ratio of input capacitance to output capacitance, and the noise suppression is better for a weak signal. The ratio of input capacitance to output capacitance is increased, and the magnification is increased, and they are not affected by either changes of process, nor the working voltage and temperature. The problem that different ranges need different magnifications is solved, and the resolution of a weak signal is increased.

The foregoing implementations are merely specific embodiments of the present disclosure, and are not intended to limit the protection scope of the present disclosure. It should be noted that any variation or replacement readily figured out by persons skilled in the art within the technical scope disclosed in the present disclosure shall all fall into the protection scope of the present disclosure. Therefore, the protection scope of the present disclosure shall be subject to the protection scope of the claims.

What is claimed is:

1. A signal amplification circuit, comprising:
a low-pass filter circuit comprising a first input terminal, a second input terminal, a first switch, a second switch, a first rheostat, a second rheostat, a first capacitor, a second capacitor, a first output terminal, and a second output terminal, wherein the first input terminal is connected to the first output terminal via the first switch and the first rheostat, the second input terminal is connected to the second output terminal via the second switch and the second rheostat; the first capacitor and the second capacitor are connected between the first output terminal and the second output terminal, respectively, with their polarity opposite to each other;
a buffer circuit comprising a third input terminal, a fourth input terminal, a first operational amplifier (op-amp), a second op-amp, a third switch, a fourth switch, a fifth switch, a sixth switch, a seventh switch, an eighth switch, a ninth switch, a tenth switch, an eleventh switch, a twelfth switch, a thirteenth switch, a fourteenth switch, a third output terminal, and a fourth output terminal, wherein the third input terminal is connected to a positive input terminal of the first op-amp via the third switch, and the third input terminal is connected to a negative input terminal of the first op-amp via the fourth switch; the positive output terminal of the first op-amp is connected to the third output terminal via the fifth switch, and the negative output terminal of the first op-amp is connected to the third output terminal via the sixth switch; the positive input terminal of the first op-amp is connected to the negative output terminal of the first op-amp via the seventh switch, and the negative input terminal of the first op-amp is connected to the positive output terminal of the first op-amp via the eighth switch; the fourth input terminal is connected to a positive input terminal of the second op-amp via the ninth switch, and the fourth input terminal is connected to a negative input terminal of the second op-amp via the tenth switch; the positive output terminal of the second op-amp is connected to the fourth output terminal via the eleventh switch, and the negative output terminal of the second op-amp is connected to the fourth output terminal via the twelfth switch; the positive input terminal of the second op-amp is connected to the negative output terminal of the second op-amp via the thirteenth switch, and the negative input terminal of the second op-amp is connected to the positive output terminal of the second op-amp via the fourteenth switch;

a switched-capacitor integrator circuit comprising a fifth input terminal, a sixth input terminal, a third op-amp, a first switched capacitor module, a second switched capacitor module, a third switched capacitor module, a fourth switched capacitor module, a first capacitor module, a second capacitor module, a first chopper modulator, a second chopper modulator, a third chopper modulator, a fifth output terminal, and a sixth output terminal, wherein each of the switched capacitor modules comprises a capacitor and at least four switches, which form a switched capacitor structure; each of the capacitor modules comprises an adjustable capacitor and at least one switch, and the capacitor and the switch are connected in parallel; each of the chopper modulators comprises at least four switches which form a chopping modulating structure; the fifth input terminal is connected to a positive input terminal of the third op-amp sequentially via the first switched capacitor module and the first chopper modulator, and the sixth input terminal is connected to a negative input terminal of the third op-amp sequentially via the second switched capacitor module and the first chopper modulator; the positive input terminal of the third op-amp is connected to the fifth output terminal sequentially via the second chopper modulator and the first capacitor module, and the negative input terminal of the third op-amp is connected to the sixth output terminal sequentially via the second chopper modulator and the second capacitor module; the positive input terminal of the third op-amp is connected to the fifth output terminal via the third switched capacitor module, and the negative input terminal of the third op-amp is connected to the sixth output terminal via the fourth switched capacitor module; the positive output terminal of the third op-amp is connected to the sixth output terminal via the third chopper modulator, and the negative output terminal of the third op-amp is connected to the fifth output terminal via the third chopper modulator; and a signal switch configured to control on or off of a voltage signal before amplification; wherein the first input terminal and the second input terminal input the voltage signal before amplification; the first output terminal is connected to the third input terminal, the second output terminal is connected to the fourth input terminal, the third output terminal is connected to the fifth input terminal, and the fourth output terminal is connected to the sixth input terminal; the fifth output terminal and the sixth output terminal output an amplified voltage signal.

2. The signal amplification circuit of claim 1, wherein each of the switched capacitor modules comprises the capacitor, a first control switch, a second control switch, a third control switch, and a fourth control switch; a first plate of the capacitor is connected to an input terminal of the switched capacitor module via the first control switch, and is further connected to ground via the second control switch; a second plate of the capacitor is connected to an output terminal of the switched capacitor module via the third control switch, and the second plate of the capacitor is further connected to the ground via the fourth control switch.

3. The signal amplification circuit of claim 1, wherein the capacitors in the first switched capacitor module and the second switched capacitor module are adjustable capacitors.

4. The signal amplification circuit of claim 1, wherein the signal amplification circuit further comprises a first connecting switch, a second connecting switch, a third connecting switch, and a fourth connecting switch; both ends of the capacitor in the first switched capacitor module are connected in parallel with both ends of the capacitor in the third switched capacitor module via the first connecting switch and the second connecting switch, respectively; both ends of the capacitor in the second switched capacitor module are connected in parallel with both ends of the capacitor in the fourth switched capacitor module via the third connecting switch and the fourth connecting switch, respectively.

5. The signal amplification circuit of claim 1, wherein the adjustable capacitor comprises a plurality of capacitors and a plurality of switches; each of the plurality of capacitors and each of the plurality of switches are connected in series to form a capacitor branch, and all capacitor branches are connected in parallel.

6. The signal amplification circuit of claim 1, wherein the switch of the adjustable capacitor in the capacitor module is adjacent to an input terminal of the capacitor module; the switch of the adjustable capacitor in the first switched capacitor module is adjacent to an output terminal of the first switched capacitor module, and the switch of the adjustable capacitor in the second switched capacitor module is adjacent to an output terminal of the second switched capacitor module.

7. The signal amplification circuit of claim 1, wherein the chopper modulator comprises a first chopper switch, a second chopper switch, a third chopper switch, and a fourth chopper switch; a first input terminal of the chopper modulator is connected to a first output terminal of the chopper modulator via the first chopper switch, and the first input terminal of the chopper modulator is connected to a second output terminal of the chopper modulator via the second chopper switch; a second input terminal of the chopper modulator is connected to the second output terminal of the chopper modulator via the third chopper switch, and the second input terminal of the chopper modulator is connected to the first output terminal of the chopper modulator via the fourth chopper switch.

8. The signal amplification circuit of claim 1, further comprising a sensor connected to ground via the signal switch; wherein the sensor is further connected to the first input terminal and second input terminal of the low-pass filter circuit; the sensor uses a resistance change of its own to output a differential outputted voltage as the voltage signal before amplification.

9. The signal amplification circuit of claim 8, wherein the sensor is an acceleration sensor composed of a Wheatstone bridge circuit using a varistor element.

10. The signal amplification circuit of claim 1, wherein all the switches are semiconductor device switches controlled by a plurality of sets of switch signals.

* * * * *